* United States Patent

(12) United States Patent
Pentakota et al.

(10) Patent No.: US 7,804,328 B2
(45) Date of Patent: Sep. 28, 2010

(54) SOURCE/EMITTER FOLLOWER BUFFER DRIVING A SWITCHING LOAD AND HAVING IMPROVED LINEARITY

(75) Inventors: Visvesvaraya Appala Pentakota, Bangalore (IN); Nitin Agarwal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 145 days.

(21) Appl. No.: 12/199,804

(22) Filed: Aug. 28, 2008

(65) Prior Publication Data
US 2009/0315594 A1    Dec. 24, 2009

(30) Foreign Application Priority Data
Jun. 23, 2008    (IN) .................... 1531/CHE/2008

(51) Int. Cl.
*H03K 17/16* (2006.01)
*H03B 1/00* (2006.01)
(52) U.S. Cl. ................. 326/82; 326/31; 326/34; 327/108; 327/111
(58) Field of Classification Search ............ 326/31, 326/34, 82–83, 86–87; 327/108–112
See application file for complete search history.

(56) References Cited

U.S. PATENT DOCUMENTS

| 4,628,274 | A | * | 12/1986 | Vittoz et al. | ................ | 330/9 |
| 4,877,979 | A | * | 10/1989 | Sempel | ................ | 327/555 |
| 5,280,511 | A | * | 1/1994 | Fujii et al. | ................ | 377/60 |
| 5,365,199 | A | * | 11/1994 | Brooks | ................ | 330/291 |
| 5,696,459 | A | * | 12/1997 | Neugebauer et al. | ........ | 327/108 |
| 5,701,136 | A | * | 12/1997 | Huq et al. | ................ | 345/100 |
| 5,872,473 | A | * | 2/1999 | Williams | ................ | 327/108 |
| 6,181,314 | B1 | * | 1/2001 | Nakajima et al. | ........... | 345/100 |
| 6,225,859 | B1 | * | 5/2001 | Irvine et al. | ................ | 327/552 |
| 6,243,066 | B1 | * | 6/2001 | Murakami et al. | ........... | 345/98 |
| 6,255,852 | B1 | * | 7/2001 | Forbes et al. | ................ | 326/86 |
| 6,313,819 | B1 | * | 11/2001 | Maekawa et al. | ............. | 345/92 |
| 6,433,592 | B1 | * | 8/2002 | Ehben | ................ | 327/108 |
| 6,727,729 | B2 | * | 4/2004 | Brooks et al. | ................ | 326/68 |
| 6,756,817 | B2 | * | 6/2004 | Tamura et al. | ................ | 326/86 |
| 6,876,235 | B2 | * | 4/2005 | Li et al. | ................ | 327/112 |
| 6,927,618 | B2 | * | 8/2005 | Kimura et al. | ............. | 327/427 |
| 6,933,874 | B2 | | 8/2005 | Pentakota | | |
| 7,049,848 | B2 | * | 5/2006 | Brooks et al. | ................ | 326/68 |
| 7,075,342 | B2 | * | 7/2006 | Nishimura | ................ | 327/108 |
| 7,123,250 | B2 | * | 10/2006 | Kimura et al. | ............. | 345/211 |
| 7,126,377 | B2 | * | 10/2006 | Brooks et al. | ................ | 326/63 |

(Continued)

*Primary Examiner*—James H. Cho
*Assistant Examiner*—Matthew C Tabler
(74) *Attorney, Agent, or Firm*—John J. Patti; Wade J. Brady, III; Frederick J. Telecky, Jr.

(57) ABSTRACT

A source follower or emitter follower buffer provided according to an aspect of the present invention includes a capacitor connected between the input path and a node formed by the junction of a pair of transistors forming a cascoded current source connected to the output of the buffer. The capacitor passes input signal current directly to a switching load connected to the output of the buffer, and very little signal-dependant current flows through the transistor receiving the input signal. As a result, input-output non-linearity due to signal-dependant modulation (variation) of transconductance of the transistor receiving the input signal is minimized. When incorporated in switched-capacitor analog to digital converters, the buffer facilitates generation of digital codes that represent an input signal more accurately.

16 Claims, 2 Drawing Sheets

U.S. PATENT DOCUMENTS

| | | | |
|---|---|---|---|
| 7,158,065 B2 * | 1/2007 | Lin et al. | 341/144 |
| 7,221,194 B2 * | 5/2007 | Lin et al. | 327/108 |
| 7,327,168 B2 * | 2/2008 | Kimura | 326/88 |
| 7,339,402 B2 * | 3/2008 | Alenin et al. | 326/109 |
| 7,378,883 B1 * | 5/2008 | Hsueh | 327/108 |
| 7,405,720 B2 * | 7/2008 | Nakajima et al. | 345/100 |
| 7,411,430 B2 * | 8/2008 | Cheng et al. | 327/108 |
| 7,429,873 B2 * | 9/2008 | Peschke | 326/81 |
| 7,525,386 B2 * | 4/2009 | Kim et al. | 330/295 |
| 7,528,643 B2 * | 5/2009 | Kimura | 327/310 |
| 7,545,184 B2 * | 6/2009 | Sun | 327/112 |
| 7,557,848 B2 * | 7/2009 | Koyama | 348/308 |
| 7,586,375 B2 * | 9/2009 | Kim et al. | 330/295 |
| 7,636,075 B2 * | 12/2009 | Shin | 345/77 |
| 7,652,702 B2 * | 1/2010 | Murakami et al. | 348/294 |
| 7,675,315 B2 * | 3/2010 | Tadeparthy | 326/30 |
| 2003/0174009 A1 * | 9/2003 | Kimura et al. | 327/427 |
| 2004/0095159 A1 * | 5/2004 | Kimura | 326/33 |
| 2004/0178831 A1 * | 9/2004 | Li et al. | 327/112 |
| 2004/0183772 A1 * | 9/2004 | Nakajima et al. | 345/102 |
| 2006/0152461 A1 * | 7/2006 | Kida et al. | 345/98 |
| 2007/0040591 A1 * | 2/2007 | Yu et al. | 327/108 |
| 2007/0090860 A1 * | 4/2007 | Hsu | 327/108 |
| 2007/0194809 A1 * | 8/2007 | Tadeparthy | 326/82 |

* cited by examiner

SOURCE/EMITTER FOLLOWER BUFFER DRIVING A SWITCHING LOAD AND HAVING IMPROVED LINEARITY

RELATED APPLICATION

The present application claims the benefit of co-pending India non-provisional application serial number: 1531/CHE/2008, entitled: "SOURCE/EMITTER FOLLOWER BUFFER DRIVING A SWITCHING LOAD AND HAVING IMPROVED LINEARITY", filed on Jun. 23, 2008, naming Texas Instruments Inc. (the intended assignee) as the Applicant, and the same inventors as in the subject application as inventors, and is incorporated in its entirety herewith.

BACKGROUND

1. Field of the Invention

The present invention relates generally to buffers used in semiconductor circuits, and more specifically to a source/emitter follower buffer that drives a switching load, and has improved linearity.

2. Related Art

Buffers are often used in a semiconductor device to isolate one portion of the device from another portion, generally to minimize the characteristics of one portion from influencing the operation of the other portion. A buffer generally contains at least one transistor and the buffer is termed as a source follower when the output is provided from a source terminal and as an emitter follower when the output is provided from an emitter terminal. In both cases, the input signal is provided to the control (gate or base) terminal of the transistor.

Buffers often drive switching loads. A switching load generally refers to a load which is electrically connected and disconnected from (a source of) a signal in different intervals of time. Examples of switching loads include switched-capacitor components such as switched-capacitor analog to digital converters (ADC), switched capacitor filters, etc. In a common configuration associated with switching loads, a buffer receives the input signal, and provides a corresponding output signal to the switching load.

It is generally desirable that an output signal of a buffer have as linear a relation as possible with an input signal, i.e., the buffer operate with a high degree of linearity to ensure that the output signal is a correct representation of the input signal.

SUMMARY OF THE INVENTION

A source follower or emitter follower buffer provided according to an aspect of the present invention includes a capacitor connected between the input path and a node formed by the junction of a pair of transistors forming a cascoded current source connected to the output of the buffer. The capacitor passes input signal current directly to a switching load connected to the output of the buffer, and very little signal-dependant current flows through the transistor receiving the input signal.

As a result, input-output non-linearity due to signal-dependant modulation (variation) of transconductance of the transistor receiving the input signal is minimized.

When incorporated in switched-capacitor analog to digital converters, the buffer facilitates generation of digital codes that represent an input signal more accurately.

Several aspects of the invention are described below with reference to examples for illustration. It should be understood that numerous specific details, relationships, and methods are set forth to provide a full understanding of the invention. One skilled in the relevant arts, however, will readily recognize that the invention can be practiced without one or more of the specific details, or with other methods, etc. In other instances, well known structures or operations are not shown in detail to avoid obscuring the features of the invention.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF EXAMPLE EMBODIMENTS

1. Example Circuit

Figure 1:
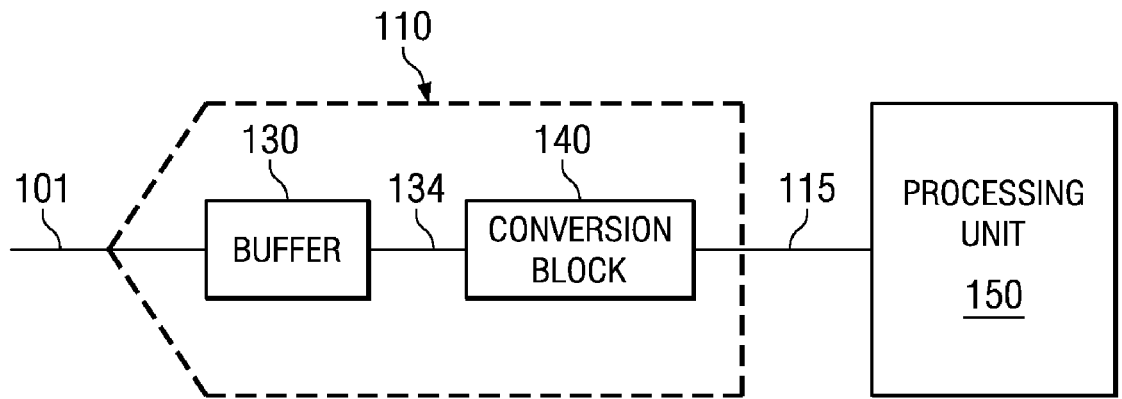
FIG. 1 is a block diagram of an example circuit in which several aspects of the present invention can be implemented.

FIG. 1 is a block diagram of an example circuit in which several aspects of the present invention can be implemented. The diagram is shown containing switched-capacitor analog to digital converter (ADC) 110 and processing unit 150. Switched-capacitor ADC 110 is, in turn, shown containing buffer 130 and conversion block 140. Each of switched-capacitor ADC 110 and processing unit 150 may be implemented in the form of either separate integrated circuits (IC) or combined in a single IC.

Processing unit 150 receives on path 115 digital codes representing the strength (magnitude) of samples of input signal 101 at corresponding time instances, and operates to process the digital codes in a desired manner. Processing unit 150 may, for example, correspond to a digital signal processor (DSP), and may execute software instructions to process the codes to implement a desired functionality.

Buffer 130 receives an input signal on path 101, and provides a buffered output signal on path 134. Conversion block 140 performs analog to digital conversion of the signal on path 134, and contains sampling circuitry to store samples of signal 134 at time instances specified by one or more sampling clocks (not shown). Specifically, the sampling circuit contains at least one sampling capacitor and a switch (driven on or off by a sampling clock) on which charge corresponding to the magnitude of signal 134 is stored. Conversion block 140 provides digital codes representing the magnitudes of signal 134 on path 115.

Buffer 130 may be implemented as a source follower or emitter follower according to several aspects of the present invention. The features of the present invention will be clearer in comparison to a prior approach, and accordingly the prior approach is described next with respect to FIGS. 2 and 3.

2. Prior Source/Emitter Follower Buffer

Figure 2:
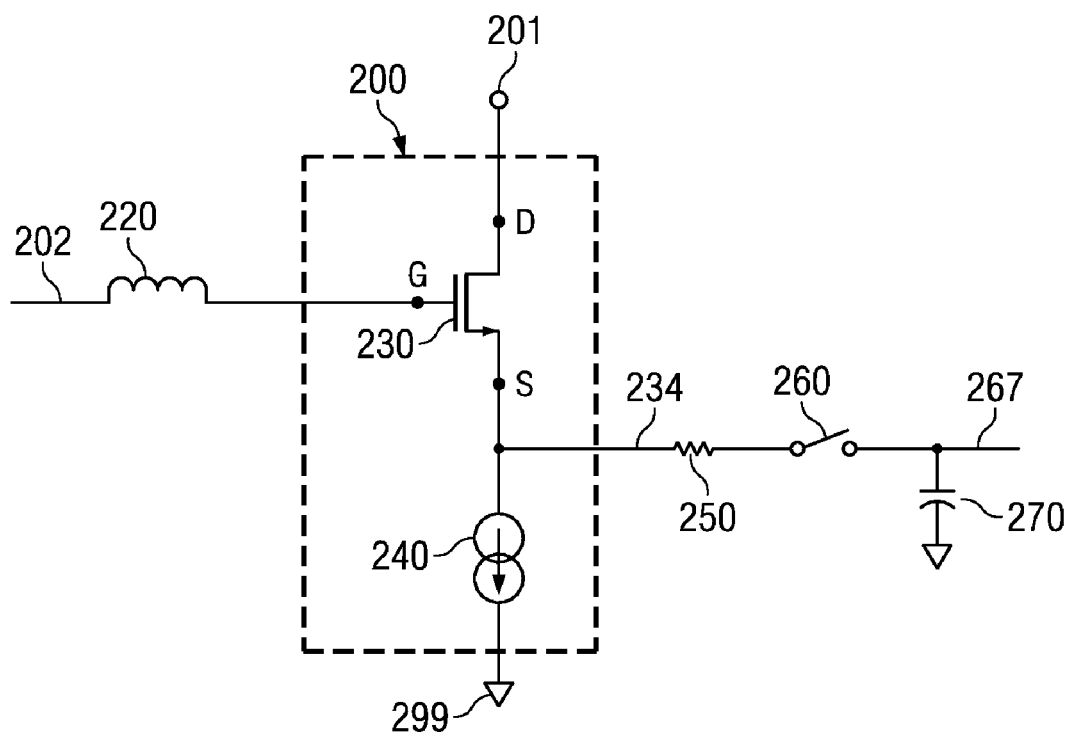
FIG. 2 is a circuit diagram illustrating the details of a prior source follower buffer.

FIG. 2 is a circuit diagram illustrating the details of a prior source follower buffer. A portion of the sampling circuitry which may be contained within a conversion block (such as conversion block 140 of FIG. 1) is also shown in the Figure.

Terminals 201 and 299 represent power and ground terminals respectively (reference potentials in general). Inductor 220 represents the inductance (which may be a distributed inductance on the path, rather than the lumped inductance shown in FIG. 2) due to bond wire and package lead (pin) through which an input signal is provided to buffer 130.

Prior buffer 200, which may be implemented in the place of buffer 130 of FIG. 1, is shown containing N-type metal oxide semiconductor transistor (NMOS), and current source (or current sink) 240. The source, gate and drain terminals of NMOS 230 are indicated in FIG. 2 as S, G and D respectively. Input signal 202 is provided (via inductance 220) to the gate terminal of NMOS 230, and the buffered output 234 is provided at the source terminal of NMOS 230.

Current source 240 maintains a constant current from the source terminal of NMOS 230 to ground (node 299). Buffer 200 is, therefore, provided as a source follower buffer. When a bipolar junction transistor (BJT) (not shown) is implemented in place of NMOS 230, buffer 200 may be referred to as an emitter follower buffer, in which case the output is provided at the emitter terminal of the BJT.

Output 234 is sampled by the combination of switch 260 and sampling capacitor 270. Resistor 250 may represent the resistance of switch 260. Switch 260, which may be implemented as an analog (e.g., CMOS) switch, is closed during a sampling interval, and causes sampling capacitor 270 to store a charge representative of the magnitude of signal 234.

During a subsequent conversion interval, switch 260 is opened, and the sampled charge on (or voltage across) sampling capacitor 270 is available on path 267. Conversion circuitry (such as that which would be contained in conversion block 140 of FIG. 1) receives the sampled voltage on path 267, and generates a corresponding digital code representing the magnitude of signal 234.

Figure 3:
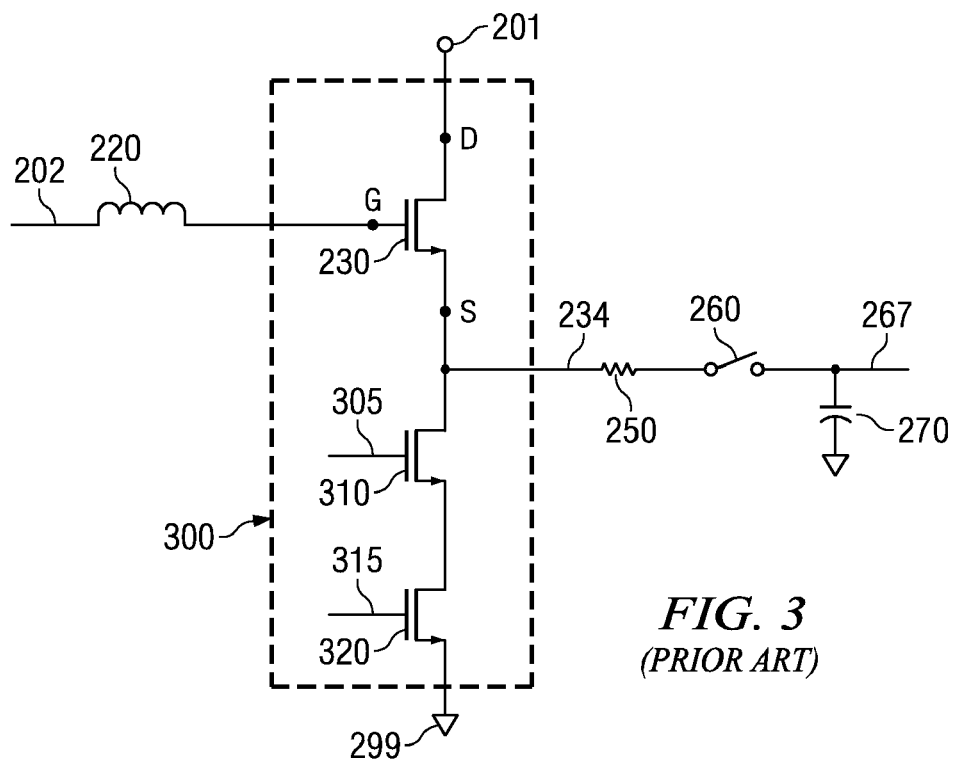
FIG. 3 is a circuit diagram illustrating the details of another prior source follower buffer.

FIG. 3 illustrates the circuit details of a prior buffer 300, in which current source 240 is implemented as a cascode circuit, shown containing transistors NMOS 310 and 320. Gate terminals 305 and 315 of NMOS 310 and 320 respectively receive a bias voltage.

In both of prior buffers 200 and 300, very little (or zero) current flows into the gate terminal of NMOS 230 due to the high gate impedance of NMOS 230, thereby isolating input 202 from the switching load represented by the combination of switch 260 and sampling capacitor 270. Switching transients which would otherwise (had input 202 been directly provided on path 234, without the use of buffer 200) have resulted due to inductance 220 and the switching load are prevented. Buffers 200 and 300, thus, shield the effects of the switching load from the input signal path.

However, the relation between output 234 and input 202 may not be linear. As is well known, current through NMOS 230 (drain current Id) has a square-law relation with respect to the gate-to-source voltage Vgs. Transconductance Gm (ΔId/ΔVgs) of NMOS 230 is dependent on the total current Id flowing through NMOS 230. Assuming zero current flows into the gate terminal of NMOS 230, the voltage at the gate terminal is the input voltage 202 (V202).

Drain current Id maybe expressed by the following equation:

$$Id = Iq + \text{Isignal} \quad \text{Equation 1}$$

wherein, Iq is the constant current flowing into the current source (240 in FIG. 2 or cascode current source formed by transistors 310 and 320 in FIG. 3), and Isignal (signal-dependent current) is the current representing input signal 202, and flows on path 234.

As is well known in the relevant arts, Isignal (the signal dependant current) may cause the voltage drop (Vdrop) between the gate and source terminals of NMOS 230 to vary, depending on the value of Isignal.

Output voltage 234 (V234) is related to V202 by the following equation:

$$V234 = V202 - V\text{drop} \quad \text{Equation 2}$$

wherein, Vdrop is the voltage between the gate and source terminals of NMOS 230.

Vdrop may, in turn be expressed by the following equation:

$$V\text{drop} = V202 - (Vt + V(V202)) \quad \text{Equation 3}$$

wherein,

Vt is a constant voltage, and

V(V202) represents a voltage that is a function of input voltage V202 or Isignal.

Since Vdrop is not a constant, but varies depending on input signal 202, it may be observed from equation 2 above that the relation between output voltage V234 and input voltage V202 is not linear. As a result, output signal 234 (which is sampled by conversion circuitry within conversion block 140 of FIG. 1) may not be a correct representation of input signal 202, and thus cause the output digital code generated by switched-capacitor ADC 110 (FIG. 1) to contain errors.

The extent of non-linearity noted above is generally greater when transconductance Gm has a lower value. Although implementation of the transistors of FIGS. 2 and 3 as BJTs may cause a relatively smaller degree of non-linearity (due to the inherent larger values of transconductance of BJTs), even such smaller degrees of non-linearities may be unacceptable at least in some operational environments.

Several aspects of the present invention provide a source/ emitter follower buffer with improved non-linearity, and thus better suited to driving switching loads, as described next with respect to an example embodiment.

3. Source/Emitter Follower Buffer with Improved Linearity

Figure 4:
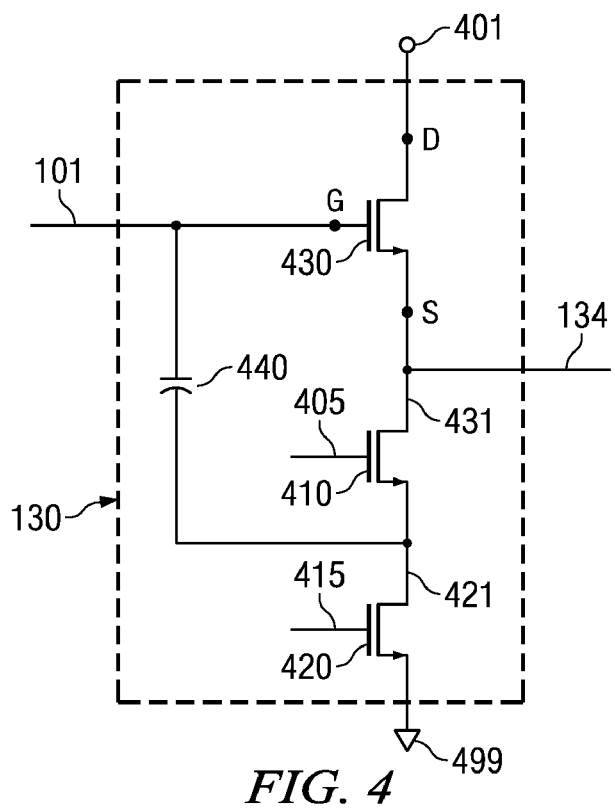
FIG. 4 is a circuit diagram of a source/emitter follower buffer in an embodiment of the present invention.

FIG. 4 is a circuit diagram of a source/emitter follower buffer in an embodiment of the present invention. Buffer 130 is shown containing transistors 410, 420 and 430. Although represented in FIG. 4 as MOS devices, transistors 410, 420 and 430 may be implemented as either MOS or BJT devices. Terminals 401 and 499 represent power and ground terminals respectively.

Transistors 410 and 420 are connected in a cascode configuration, and operate as a high impedance current source, similar to the combination of transistors 310 and 320 of FIG. 3. Bias voltages 405 and 415 for transistors 410 and 420 respectively may be generated internal to buffer 130, and operate to set the value of respective currents through the transistors 410 and 420, as is well known in the relevant arts. Transistor 430 receives input signal 101 on its gate terminal, and provides a buffered output signal 134 on its source terminal.

Capacitor 440 is connected between input path 101 and node 421, and passes signal current (Is) representing variations in input voltage 101 directly to a switching load (which may be connected to path 134, but not shown). Capacitor 440, thus, reduces (or removes completely) flow of signal-dependant current through transistor 430, as described below.

The looking-in impedance at node 421 (looking into transistor 410) is very low. Denoting the current through transistor 420 as I420, and signal current through capacitor 440 as Is, current through transistors 410 can be expressed by the following equation:

$$I410 = I420 - Is \quad \text{Equation 4}$$

wherein, 1410 is the current through transistor 410 (current 1420 through transistor 420 being constant due to the current source configuration).

Denoting the current on output path 134 as I0, the current through transistor 430 is provided by the following equation:

$$I430 = I420 - Is + I0 \qquad \text{Equation 5}$$

When a load (such as capacitor 270 of FIG. 3) is connected to output 134, Is equals (or very nearly equals) I0, if capacitor 440 equals the load on output path 134. As a result most of signal current Is flows through output path 134. Therefore, from equation 5 above, current 1430 through transistor 430 equals 1420, which is a constant value.

Therefore, capacitor 440 provides signal current Is (or at least a large proportion of Is) directly to a switching load connected to path 134, and no (or very little) signal-dependant current flows through transistor 430.

As a result, signal-dependant change in transconductance Gm of transistor 430, and therefore changes in the voltage drop (Vdrop of equations 2 and 3) between the gate and source terminals of transistor 430 are prevented, or at least minimized. Hence, output 134 of buffer 130 of FIG. 4 varies linearly as input 101 varies, and is a more accurate representation of input 101.

Transistor 430 of buffer 130 of FIG. 4 may be viewed as providing an output voltage at the output (source) terminal/node that varies linearly with the input voltage, while capacitor 440 passes the current due to (or caused by) the input signal directly to the switching load.

Thus, input-output non-linearity due to signal-dependant modulation (variation) of transconductance of the source/emitter follower buffer is minimized. It is noted that when the switching load is disconnected from output path 134, current through transistor 430 may change. However, such change in the disconnected state may not be of concern.

As noted above, output transients that may be caused by inductance present in the input path because of a switching load are also prevented, due to the high input impedance at the gate terminal of transistor 430. Source/emitter follower buffer 130 can, therefore, support high input signal frequencies as well.

Further, as most of the signal current from the input (101) is provided by capacitor 440 directly to the output (and to the switching load), power consumed by buffer 130 (current drawn from power supply 401) is reduced.

Buffer 130 of FIG. 4 may be implemented in switched-capacitor ADC 110 of FIG. 1, and enables switched-capacitor ADC 110 to provide digital codes which represent input signal 101 more accurately.

It should be appreciated that the specific type of transistors (NMOS, BJT etc.) noted above are merely by way of illustration. However, alternative embodiments using different configurations and transistors will be apparent to one skilled in the relevant arts by reading the disclosure provided herein. For example, the NMOS transistors may be replaced with PMOS (P-type MOS) transistors, while also interchanging the connections to power and ground terminals.

Accordingly, in the instant application, the power and ground terminals are referred to as reference potentials, the source (emitter) and drain (collector) terminals of transistors (though which a current path is provided when turned on and an open path is provided when turned off) are termed as current terminals, and the gate (base) terminal is termed as a control terminal.

Furthermore, though the terminals are shown with direct connections to various other terminals, it should be appreciated that additional components (as suited for the specific environment) may also be present in the path, and accordingly the connections may be viewed as being electrically coupled to the same connected terminals.

In addition, the circuit topology of FIG. 4 is merely representative. Various modifications, as suited for the specific environment, without departing from the scope and spirit of several aspects of the present invention, will be apparent to one skilled in the relevant arts by reading the disclosure provided herein.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A buffer comprising:
   an input terminal;
   an output terminal;
   a first transistor having a first passive electrode, a second passive electrode, and a control electrode, wherein the control electrode of the first transistor is coupled to the input terminal, and wherein the second passive electrode of the first transistor is coupled to the output terminal;
   a second transistor having a first passive electrode, a second passive electrode, and a control electrode, wherein the control electrode of the second transistor receives a first bias voltage, and wherein the first passive electrode of the second transistor is coupled to the output terminal;
   a third transistor having a first passive electrode, a second passive electrode, and a control electrode, wherein the control electrode of the second transistor receives a second bias voltage, and wherein the second passive electrode of the second transistor is coupled to the first passive electrode of the third transistor; and
   a capacitor that is coupled between the input terminal and the first passive electrode of the third transistor.

2. The buffer of claim 1, wherein the third transistor is an NMOS transistor, wherein the first and second passive electrodes of the third transistor are its drain and source, respectively.

3. The buffer of claim 2, wherein the first transistor is an NMOS transistor, wherein the first and second passive electrodes of the first transistor are its drain and source, respectively.

4. The buffer of claim 3, wherein the second transistor is an NMOS transistor, wherein the first and second passive electrodes of the second transistor are its drain and source, respectively.

5. The buffer of claim 2, wherein the first transistor is an NPN transistor, wherein the first and second passive electrodes are the collector and emitter, respectively.

6. The buffer of claim 5, wherein the second transistor is an NPN transistor, wherein the first and second passive electrodes are the collector and emitter, respectively.

7. The buffer of claim 2, wherein the buffer further comprises analog- to-digital conversion circuitry that is coupled to the output terminal.

8. A buffer comprising:
   a input terminal;
   an output terminal;
   a follower transistor that is coupled to the input terminal;
   a first bias transistor that is coupled to the follower transistor and the output terminal and that receives a first bias voltage;

a second bias transistor that is coupled between the first bias transistor and ground and that receives a second bias voltage; and a capacitor that is coupled between the input terminal and a node between the first bias transistor and the second bias transistor.

9. The buffer of claim 8, wherein the second bias transistor further comprises an NMOS transistor that receives the second bias voltage at its gate and that is coupled to the output terminal at its drain.

10. The buffer of claim 9, wherein the second bias transistor is coupled to ground at its source.

11. The buffer of claim 10, wherein the follower transistor further comprises an NMOS transistor that is coupled to the input terminal at its gate.

12. The buffer of claim 11, wherein the first bias transistor is an NMOS transistor that is coupled to the source of the follower transistor at its drain, that receives the first bias voltage at its gate, and that is coupled to the output terminal at its drain.

13. The buffer of claim 9, wherein the follower transistor is an NPN transistor that is coupled to the input terminal at its base.

14. The buffer of claim 13, wherein the first bias transistor is an NPN transistor that receives the first bias voltage at its base, that is coupled to the emitter of the follower transistor at its collector, and that is coupled to the output terminal at its collector.

15. The buffer of claim 9, wherein the buffer further comprises analog- to-digital conversion circuitry that is coupled to the output terminal.

16. An analog-to-digital converter comprising: a buffer having:

an input terminal that receives an input signal;

an output terminal; a first NPN transistor that is coupled to the input terminal at its base, that receives a supply voltage at its collector, and that is coupled to the output terminal at its emitter;

a second NPN transistor that is coupled to output terminal at its collector and that receives a first bias voltage at its base;

an NMOS transistor that is coupled to the emitter of the second NPN transistor at its drain, that receives a second bias voltage at its gate, and that is coupled to ground at its source; and a capacitor that is coupled between the input terminal and the drain of the NMOS transistor; and analog-to-digital conversion circuitry that is coupled to the output terminal of the buffer.

\* \* \* \* \*